(12) United States Patent
Dowling

(10) Patent No.: US 8,174,338 B2
(45) Date of Patent: May 8, 2012

(54) IMPEDANCE TRANSFORMING HYBRID COUPLER

(75) Inventor: Thomas J. Dowling, Holbrook, NY (US)

(73) Assignee: Innovative Power Products, Inc., Holbrook, NY (US)

( * ) Notice: Subject to any disclaimer, the term of this patent is extended or adjusted under 35 U.S.C. 154(b) by 243 days.

(21) Appl. No.: 12/475,827

(22) Filed: Jun. 1, 2009

(65) Prior Publication Data
US 2009/0295497 A1 Dec. 3, 2009

Related U.S. Application Data

(60) Provisional application No. 61/058,092, filed on Jun. 2, 2008.

(51) Int. Cl.
*H01P 5/18* (2006.01)
*H01P 3/08* (2006.01)

(52) U.S. Cl. ........................... 333/116; 333/109

(58) Field of Classification Search ............... 333/109, 333/110, 111, 112, 116, 127, 128
See application file for complete search history.

(56) References Cited

U.S. PATENT DOCUMENTS

| | | | | |
|---|---|---|---|---|
| 4,305,043 A * | 12/1981 | Ho et al. | ............ | 330/53 |
| 6,911,879 B2 * | 6/2005 | Chiang et al. | ............ | 333/164 |
| 7,084,715 B2 * | 8/2006 | Al-Taei et al. | ............ | 333/24 R |
| 7,297,875 B2 | 11/2007 | Lauriello | | |
| 7,448,126 B2 | 11/2008 | Logothetis | | |
| 7,961,064 B2 * | 6/2011 | Kearns et al. | ............ | 333/109 |
| 8,058,947 B2 * | 11/2011 | Moll | ............ | 333/116 |

* cited by examiner

*Primary Examiner* — Dean O Takaoka
(74) *Attorney, Agent, or Firm* — Scully, Scott, Murphy & Presser, P.C.

(57) ABSTRACT

AN RF hybrid coupler is described having a coupling section and impedance matching transformer sections. The coupler, constructed of Strpline patterns, accepts an RF input signal at a first impedance value and outputs a plurality of RF signals at a second impedance value. The output RF signals are at equal amplitudes to one another and at lower amplitude than the input RF signal.

2 Claims, 2 Drawing Sheets

IMPEDANCE TRANSFORMING HYBRID COUPLER

CROSS-REFERENCE TO RELATED APPLICATIONS

Figure 1:
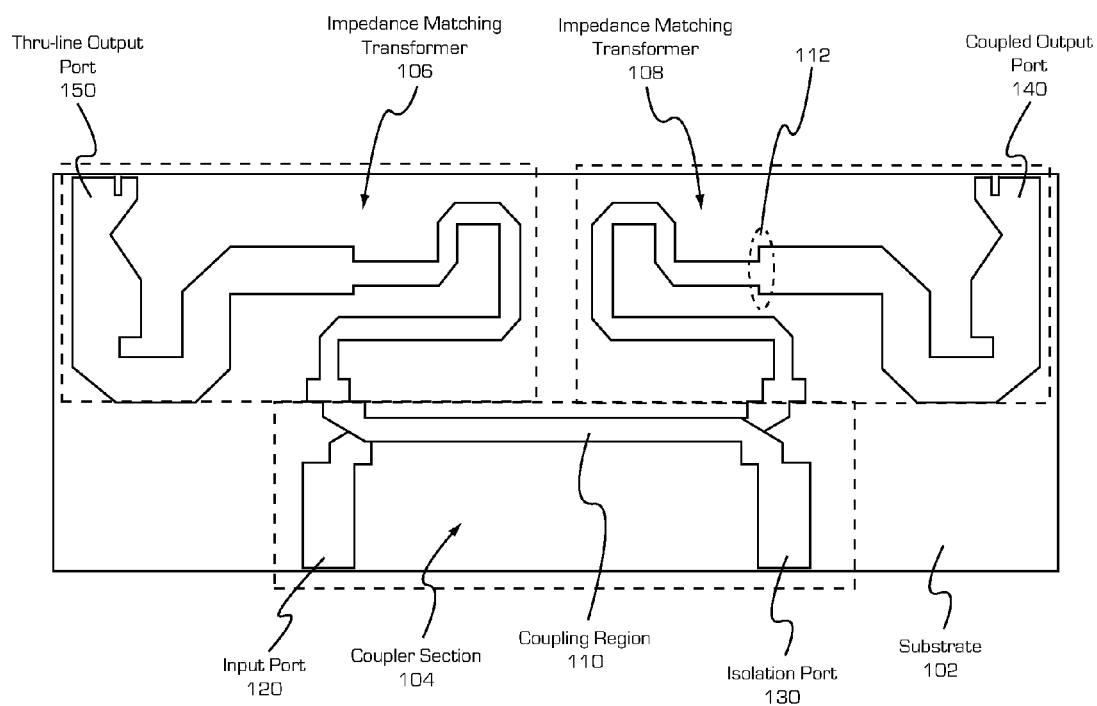

This application claims the benefit of U.S. Provisional Application No. 61/058,092 filed on Jun. 2, 2008.

I. FIELD OF THE INVENTION

The present invention relates generally to radiofrequency (RF) transmission, and more specifically to hybrid RF couplers.

II. BACKGROUND OF THE DISCLOSURE

The 3 dB, 90 degree, hybrid coupler is a 4-port device used for dividing a radiofrequency (RF) signal into two equal amplitude signals with a constant 90 degree phase difference. This style of coupler has two transmission lines passing close enough to each other for energy propagating on one line to couple onto the other line. 3 dB couplers divide the power equally between the two output ports.

There are 4-ports associated with this type of coupler. An input port, a coupled output port, a thru-line output port and an isolation port. Each port is physically the end of the two transmission lines used to create the coupler. The 90 degree phase difference between the two outputs make the couplers useful in a wide array of RF equipment such as variable attenuators, RF mixers, RF modulators, RF amplifiers and many others.

Typically the characteristic impedances (Zo) of each port are the same. In most cases the Zo is 50 or 75 Ohms. This is because the majority of RF systems and devices operate at these two impedances. However there are situations where the input Zo is different that the output Zo, for example, the input may be 25 Ohms and the output may be 50 Ohms. In this case the typical coupler, having Zo equal to 50 Ohms will not work efficiently. Consequently, an impedance transformation must be performed on the 25 Ohm input to raise the impedance up to 50 Ohms before using a typical Zo=50 Ohm coupler.

Conventionally, this impedance transformation requires additional components. However, each connection point, either between a signal line and an RF component, or between multiple RF components, can lead to signal degradation resulting from signal leakage and increased noise from signal reflection at the connection point. Consequently, RF engineers strive to limit the number of mechanical connections in an RF system.

III. SUMMARY OF THE DISCLOSURE

An embodiment of the present invention includes a substrate with an RF signal coupler, and an RF impedance matching transformer in electrical communication with the RF signal coupler. Both the RF signal coupler and the RF impedance matching transformer are disposed on the substrate.

Another embodiment of the present invention includes coupling means for outputting at least two coupled RF signals derived from an input RF signal; and an impedance matching means for transforming a characteristic impedance of the at least two RF signals from a first impedance value equal to a characteristic impedance of the input RF signal to a second impedance value. The at least two output RF signals have equal power amplitudes and a constant phase difference therebetween. In addition, the coupling means and the impedance matching means are disposed on a substrate and in electrical communication with each other.

Moreover, the RF signal coupler and the RF impedance matching transformer are Stripline elements formed on the substrate using printed circuit board (PCB) fabrication techniques.

IV. BRIEF DESCRIPTION OF THE DRAWINGS

Figure 2:
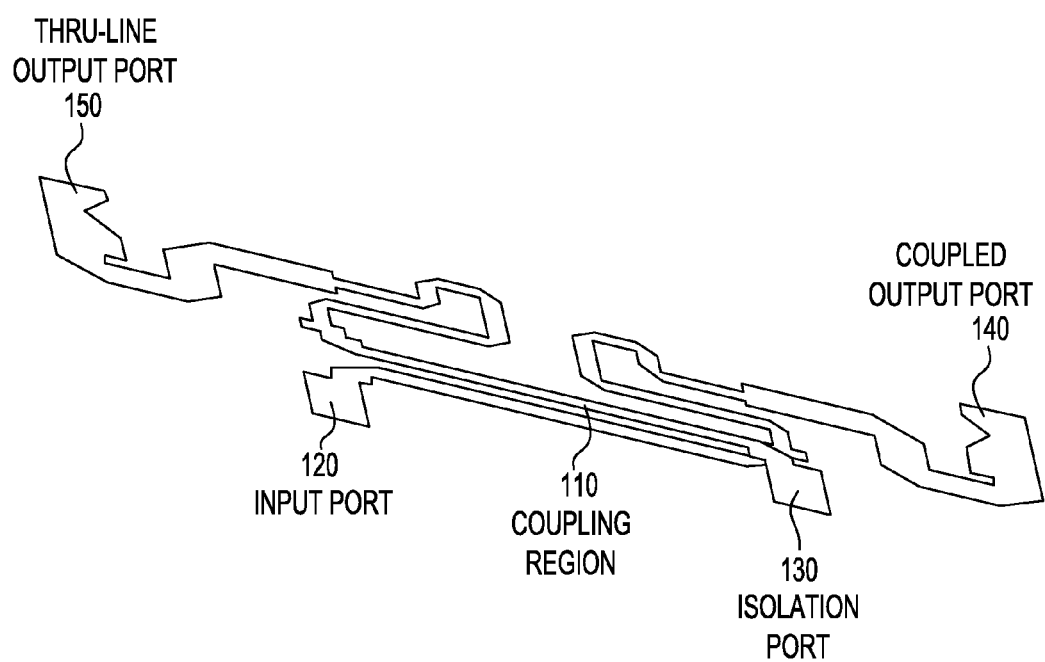

These and other features, aspects, and advantages of the present invention will become better understood with regard to the following description, appended claims, and accompanying drawings wherein:

FIG. 1 illustrates a top-down schematic view of an embodiment of the present invention; and FIG. 2 illustrates a side view of the embodiment shown in FIG. 1.

V. DETAILED DESCRIPTION OF DISCLOSURE

Referring to FIG. 1, an embodiment of the present invention is shown. The RF coupler 100 is formed on a substrate 102. The substrate 102 can be any of the well-known dielectric materials used in the integrated circuit fabrication industry, and may be laminates or ceramics. The preferred dielectric material has a low dielectric constant, thus reducing dielectric leakage.

A first Stripline pattern is formed on the bottom surface of the substrate 102 and a second Stripline pattern is formed on the top surface of the substrate 102. FIG. 1 shows the layout of the first and second Stripline patterns with respect to one another as if the substrate 102 were transparent. Each Stripline pattern has a coupler section 104 and an impedance matching transformer 106 and 108.

The first Stripline pattern has an input port 120 connectable to an RF signal source, a coupling region 110 and a coupled output port 140. The second Stripline pattern includes an isolation port 130, a coupling region 110 overlaying the coupling region of the first Stripline pattern, and a thru-line output port 150.

The properties, such as thickness, of the selected dielectric material are selected to provide adequate electromagnetic coupling between the coupling regions 110 of the first Stripline pattern and the second Stripline pattern.

The area of the Stripline pattern encircled and referenced with numeral 112 provides the impedance transformation. The impedance is altered from the impedance of the RF signal to the impedance of the output signal by changing the width of the Stripline. Thus, in the embodiment shown, the input impedance is lowered at area 112. For example, if the input impedance were 50 Ohm the impedance after passing through area 112 would be decreased to 25 Ohm. The decrease in impedance is due to the increase in the width of the Stripline pattern at area 112.

The width of the Stripline pattern at various points is determined by the particular function of the RF device, the characteristic impedance desired and the properties of the materials used for constructing the Stripline pattern. A constant width maintains the input impedance. An increase in width, as shown in FIG. 1, decreases impedance while a decrease in width results in an increase in impedance. Consequently, the embodiment shown in FIG. 1 provides a coupler that transforms a high impedance input signal into two lower impedance output signals. However, it is within the scope of the present invention to provide a coupler that transforms a low impedance input signal into two or more high impedance output signals by altering the width of Stripline pattern at area 112.

Referring to FIG. 2, a side view of the hybrid coupler of the present invention is shown. The side view shown in FIG. 2 provides a clear perspective of the disposition of the coupling regions 110 of the first Stripline pattern and the second Stripline pattern. For the sake of clarity the coupler assembly is shown without the substrate 102 layer in FIG. 2.

Specifically, the coupling regions 110 are placed in close proximity to one another such that the path of the coupling region of the first Stripline pattern overlays the path of the coupling region of the second Stripline pattern. The separation between the two coupling regions 110 is selected to provide optimal RF coupling without inducing a short circuit between the first and second Stripline patterns.

Alternative to using a dielectric substrate between the first and second Stripline patterns, an air-gap can be formed between the two Stripline patterns. In this alternative, each Stripline pattern is formed on a surface of separate substrates. The surfaces on which the Stripline patterns are formed are facing each other and separated by a predetermined space, or air-gap. The space between the two surfaces can be filled with air, other gas having a low dielectric constant, or may be vacated to form a vacuum therebetween. A spacer of a predefined height can be used between the two substrates to provide the desired separation.

In addition to constructing the coupler of the present invention from Striplines, the present invention can be fabricated using techniques such as Microstrips, lumped elements, coaxial, and coplanar waveguides. For example, the coupler section 104, if constructed using Microstrips, would have a coupling region 110 of the input port 120 and isolation port 130 disposed along side each other and on the same plane of the substrate. Microstrip configurations, such as Branchline and Lang couplers, can be used as the coupler section 104. The other fabrication techniques may require similar rearrangement of coupler elements as well known to one of ordinary skill in the art.

The present invention has been described operating in a splitter mode wherein one signal is input at the input port 120 with a given signal strength and two output signals are generated at the thru-line output port 150 and coupled output port 140 each having have the signal strength of the input signal. In addition to the splitter mode, the present invention can be operated in a combiner mode. In the combiner mode, two input signals are provided at the thru-line output port 150 and coupled output port 140. The two input signals are combined at the coupler region 110 and out put through the input port 120. The single output signal will be the combination of the two input signals having a signal strength equal to the sum of the two input signal strengths.

The described embodiments of the present invention are intended to be illustrative rather than restrictive, and are not intended to represent every embodiment of the present invention. Various modifications and variations can be made without departing from the spirit or scope of the invention as set forth in the following claims both literally and in equivalents recognized in law.

What is claimed is:

1. An RF device comprising:
coupling means for outputting at least two coupled RF signals derived from an input RF signal, said at least two output RF signals having equal power amplitudes and constant phase difference therebetween, the coupling means being configured to provide an electromagnetic coupling between the at least two coupled RF signals; and
an impedance matching means for transforming a characteristic impedance of said at least two RF signals from a first impedance value equal to a characteristic impedance of said input RF signal to a second impedance value;
said coupling means and said impedance matching means being disposed on a substrate and in electrical communication with each other.

2. An RF coupling device comprising:
a first Stripline pattern having an input port, coupling region, impedance matching transformer section and an thru-line output port, the impedance matching transformer section configured to transform an impedance of an input signal to a different impedance at the output port;
a second Stripline pattern having an isolation port, coupling region, impedance matching transformer section and a coupled output port, the impedance matching transformer section configured to transform an impedance of an input signal to a different impedance at the coupled output port; and
a dielectric material disposed between said first Stripline pattern and said second Stripline pattern, said coupling region of said first Stripline pattern over laying and positioned parallel to said coupling region of said second Stripline pattern at a separation distance defined by said dielectric material disposed therebetween.

* * * * *